(12) United States Patent
Liu et al.

(10) Patent No.: US 8,508,999 B2
(45) Date of Patent: Aug. 13, 2013

(54) VERTICAL NAND MEMORY

(75) Inventors: Zengtao Liu, Boise, ID (US); Graham Wolstenholme, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/451,656

(22) Filed: Apr. 20, 2012

(65) Prior Publication Data

US 2013/0083601 A1 Apr. 4, 2013

(30) Foreign Application Priority Data

Sep. 29, 2011 (WO) ................ PCT/US2011/053836

(51) Int. Cl.
*G11C 11/34* (2006.01)

(52) U.S. Cl.
USPC .............. 365/185.17; 365/185.27; 365/185.3; 365/185.29

(58) Field of Classification Search
USPC ................ 365/185.17, 185.27, 185.3, 185.29
See application file for complete search history.

(56) References Cited

U.S. PATENT DOCUMENTS

| | | | |
|---|---|---|---|
| 5,933,367 A | 8/1999 | Matsuo et al. | |
| 6,847,557 B2 | 1/2005 | Yang | |
| 7,230,848 B2 | 6/2007 | Forbes | |
| 7,313,029 B2 | 12/2007 | Shen | |
| 7,672,159 B2 | 3/2010 | Kuo et al. | |
| 7,701,780 B2* | 4/2010 | Mihnea et al. | ............. 365/185.3 |
| 7,852,675 B2 | 12/2010 | Maejima | |
| 7,852,676 B2 | 12/2010 | Maejima | |
| 7,859,902 B2 | 12/2010 | Maejima | |
| 7,983,084 B2 | 7/2011 | Tokiwa et al. | |

FOREIGN PATENT DOCUMENTS

WO 2013/048400 A1 4/2013

OTHER PUBLICATIONS

International Search Report and Written Opinion Received for PCT Patent Application No. PCT/US2011/053836 Mailed on Feb. 24, 2012, 8 pages.
Nitayama, et al., "Bit Cost Scalable (BiCS) Flash Technology for Future Ultra High Density Storage Devices," 2010 International Symposium on VLSI Technology Systems and Applications (VLSI-TSA), Apr. 26, 2010, pp. 130-131, IEEE, Hsinchu, Taiwan.
Jeon, et al., "High work-function metal gate and high-K dielectrics for charge trap flash memory device applications," Proceedings of ESSDERC, 2005, pp. 325-328, Grenoble, France.
Kim, Kinam, "Technology for sub-50nm DRAM and NAND Flash Manufacturing," Electron Devices Meeting, 2005. IEDM Technical Digest. IEEE International (2005), pp. 323-326.

(Continued)

*Primary Examiner* — Jason Lappas
(74) *Attorney, Agent, or Firm* — Cool Patent, P.C.

(57) ABSTRACT

A vertical NAND structure includes one or more mid-string devices having at least two functional modes. In the first mode, the one or more mid-string devices couple the bodies of stacks of NAND memory cells to the substrate for erase operations. In the second mode, the one or more mid-string devices couple the body of a first stack of NAND memory cells to a body of a second stack of memory NAND memory cells, allowing the two stacks operate as a single NAND string for read and programming operations.

30 Claims, 8 Drawing Sheets

(56) References Cited

OTHER PUBLICATIONS

Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, Jun. 16, 2009, pp. 136-137, IEEE, Honolulu, HI, US.

Tanaka, et al. "Bit Cost Scalable Technology with Punch and Plug Process for Ultra High Density Flash Memory," 2007 Symposium on VLSI Technology Digest of Technical Papers, Jun. 12, 2007, pp. 14-15, IEEE, Kyoto, Japan.

Jang, et al. "Vertical Cell Array using TCAT(Terabit Cell Array Transistor) Technology for Ultra High Density NAND Flash Memory," 2009 Symposium on VLSI Technology Digest of Technical Papers, Jun. 16, 2009, pp. 192-193, IEEE, Honolulu, HI, US.

* cited by examiner

VERTICAL NAND MEMORY

CROSS-REFERENCE TO RELATED APPLICATIONS

The present application claims the benefit under 35 U.S.C. 365(a) of International Application No. PCT/US11/53836 filed on Sep. 29, 2011. Said Application No. PCT/US11/53836 is incorporated herein by reference in its entirety.

TECHNICAL FIELD

The present subject matter relates generally to semiconductor memory devices. More specifically, the present subject matter relates to non-volatile memory devices using vertically stacked memory cells in a NAND architecture.

BACKGROUND

Semiconductor memory devices can include blocks of memory cells in a larger integrated circuit or stand-alone integrated circuits. While traditional flash memory devices build the cells in a two dimensional array, some devices may build a three dimensional array of cells. In some three dimensional flash memories, a NAND string may be built vertically, stacking the individual FETs of the string on top of each other, so that the string extends out from the substrate. Such architectures may provide for very high bit densities in a flash memory device. Because the cells are stacked vertically, however, most, if not all, of the cells are isolated from the substrate, involving a different approach to erasing the cells.

BRIEF DESCRIPTION OF THE DRAWINGS

The accompanying drawings, which are incorporated in and constitute part of the specification, illustrate various embodiments of the invention. Together with the general description, the drawings serve to explain the various principles. They should not, however, be taken to limit the invention to the specific embodiment(s) described, but are for explanation and understanding only. In the drawings.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this invention. These descriptive terms and phrases are used to convey a generally agreed upon meaning to those skilled in the art unless a different definition is given in this specification. Reference now is made in detail to the examples illustrated in the accompanying drawings and discussed below.

Figure 1:
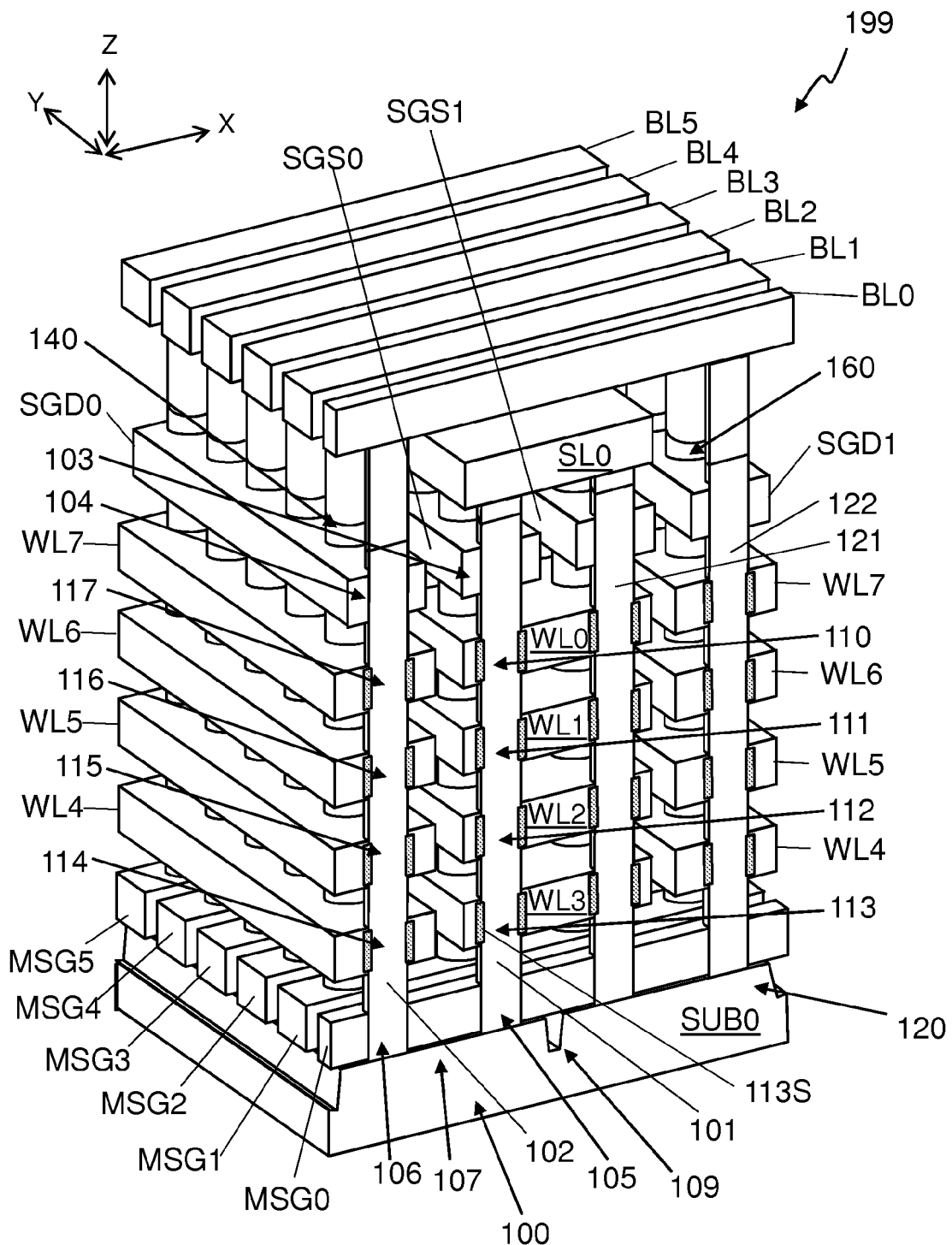
FIG. 1 shows an isometric view of an embodiment of a vertical NAND memory.

FIG. 1 shows an isometric view of an embodiment of a vertical NAND memory 199. A small portion of the vertical NAND memory 199, 4×6 stacks of 4 memory cells, is shown. Various embodiments may have any number of stacks of memory cells, with many embodiments including many millions, or even billions, of stacks of memory cells. A stack may have two or more memory cells, with some embodiments having 4, 8, 16, or 32 memory cells in a stack, although any number of memory cells may be included in a stack, including numbers that are not a power of two. In some embodiments, a single bit may be stored in an individual memory cell, but other embodiments may store multiple bits of information in a single memory cell by controlling the amount of charge stored in the charge storage region of an individual memory cell. For clarity, regions of the vertical NAND memory 199 that may be filled with an insulating material are transparent in FIG. 1, allowing the structural detail to be exposed.

The vertical NAND memory 199 is built on a substrate SUB0 having a thickness in the Z dimension extending in the X and Y dimensions much farther than its Z dimension. Stacks of memory cells are constructed on the substrate SUB0. Two memory cells may be thought of as stacked if their charge storage regions are different in the Z dimension, but the cells overlap in the X and Y dimensions. A stack of memory cells 110-113 shares a body 101 that may be constructed as a pillar of silicon, which may be polysilicon, and may have a substantially circular cross-section, extending out from the substrate SUB0 in a substantially perpendicular direction with one end of the body 101 in contact with the substrate SUB0, although some embodiments may use different geometries for the body 101. Substantially perpendicular, as used herein and in the claims, means that the angle between the centerline of the body 101 and the substrate SUB0 is 90°±about 30°. Substantially circular, as used herein and in the claims, means that the distance from the centroid of the cross section to the edge of the cross section may vary by no more than about 50%. In some embodiments, the substrate SUB0 and the body 101 may both be made of p-doped silicon, although other embodiments may use other semiconductor materials and/or different doping. Examples of other embodiments may include both the substrate SUB0 and the body 101 being made of n-doped silicon, the substrate SUB0 being made of p-doped silicon and the body 101 being made of n-doped silicon, and another embodiment where the substrate SUB0 and/or the body 101 are made of a different semiconducting material.

The stack of memory cells 110-113 includes four memory cells in the embodiment shown. The first memory cell 110 may have a polysilicon control gate that is word line 0, WL0. The second memory cell 111 may have a polysilicon control gate that is word line 1, WL1. The third memory cell 112 may have a polysilicon control gate that is word line 2, WL2, and the fourth memory cell 113 may have a polysilicon control gate that is word line 3, WL3. In the embodiment shown, the memory cells 110-113 may be built using a "gate first" process. The memory cells 110-113 have respective charge storage regions, which in this embodiment may be a floating gate, such as floating gate 113S of memory cell 113, that is located between the control gate WL3 and the body 101. Control gates that share a common body may be referred to as a set of control gates.

A second stack of memory cells 114-117 shares a body 102. In many embodiments, the second stack of memory cells has the same number of memory cells as the first stack of memory cells, but in other embodiments, the number of memory cells may be different between the two stacks. The first memory cell 114 of the second stack of memory cells may have a polysilicon control gate that is connected to word line 4, WL4. The second memory cell 115 may have a polysilicon control gate WL5 that is word line 5, WL5. The third memory cell 116 may have a polysilicon control gate that is word line 6, WL6, and the fourth memory cell 117 may have a polysilicon control gate that is word line 7, WL7. A third stack of memory cells may share a body 121 and use word lines 0-3, WL0-3, for the control gates of the memory cells. A fourth stack of memory cells may share a body 122 and use word lines 4-7, SL4-7, for its control gates. The third and fourth stacks of memory cells are built along the X dimension at the same Y coordinate as the first and second stacks. Additional stacks of memory cells, such as the fifth and sixth stacks of memory cells 140 and the seventh and eighth stack of memory cells 160, may be built along the Y dimension as shown. The word lines WL0-7 may be built at various Z levels above the substrate travelling in the Y dimension. The word lines WL0-3 used as the control gates for the first and third stacks of memory cells may be the shared wide polysilicon structures as shown, or may be separate conductors. Word lines WL4-7 may also be wide and used as shared control gates for additional stacks of memory cells built in the X dimension in other embodiments, or may be a single stack wide as shown.

One or more mid-string devices 105-107 are positioned between the substrate SUB0 and the first and second stacks of NAND memory cells. In the embodiment shown, the one or more mid-string devices include a first FET 105 positioned between the substrate SUB0 and the first stack of NAND memory cells 110-113, using the body 101 for the channel of the FET 105, and a second FET 106 positioned between the substrate SUB0 and the second stack of NAND memory cells 114-117, using the body 102 for the channel of the FET 106. The one or more mid-string devices also include a third FET 107 positioned between the first stack of NAND memory cells 110-113 and the second stack of NAND memory cells 114-117, using the substrate SUB0 for the channel of FET 107. A control line MSG0 is used as the control gate of the three FETS 105-107 that make up the one or more mid-string devices in the embodiment shown. A thin insulating layer, such as an oxide layer, around the bodies 101-102, may separate the control line MSG0 from the bodies 101-102. A thin insulating layer, such as an oxide layer, on the substrate SUB0, may separate the control line MSG0 from the substrate SUB0. In the embodiment shown, a single control line, which may be made of polysilicon, metal, or some other conductor, is used for the control gate of the three FETs 105-107, coupling the control gates together. In other embodiments, the control gates of multiple mid-string devices may be independently controlled. In yet additional embodiments, a single FET may be created having a larger channel in the substrate SUB0 to function as the one or more mid-string devices by itself.

A first mode of operation is controlling one or more mid-string devices positioned between the substrate and the first and second stacks of NAND memory cells to allow the erase voltage to propagate to the first body and the second body. In the first mode of operation, the control line MSG0 may be allowed to float, meaning that it is disconnected from a voltage or current source, and the substrate SUB0 may be driven with an erase voltage. In the first mode of operation, the substrate SUB0 is coupled to the bodies 101-102, allowing the erase voltage to propagate to the bodies 101-102. In a second mode of operation, the control line MSG0 may be driven to a voltage level different enough from the substrate SUB0, which may be grounded, to turn on the three FETS 105-107. In the second mode of operation, the first body 101 is coupled to the second body 102, and both are isolated from the substrate SUB0, transforming the first and second stacks of NAND memory into a single NAND memory string 100 for reading and programming cells of the NAND memory string 100.

In some embodiments, a source select device 103 may be positioned between a source line SL0 and an end of the first body 101 opposite of the substrate SUB0. A via may be used to connect the source line SL0 to the source select device 103. A drain select device 104 may be positioned between a bit line BL0, and an end of the second body 102 opposite of the substrate SUB0 and a via may be used to connect the bit line BL0 to the drain select device 104. The source select device 103 has control line SGS0 as its control gate and the drain select device 104 has control line SGD0 as its control gate. The NAND string 100 may be enabled for read or programming access by selectively enabling the source select device 103 using control line SGS0 and/or drain select device 104 using control line SGD0. NAND string 120, which includes the third stack of NAND memory which has body 121 and the fourth stack of NAND memory which has body 122, may be enabled using control line SGS1 to couple body 121 to source line 0 SL0 and/or control line SDG1 to couple body 122 to bit line 0 BL0.

Additional groups of NAND strings may be coupled to different control lines and/or bit lines. NAND string 140 and NAND string 160 utilize control line MSG1 to control their one or more mid-string devices and are coupled to bit line 1 BL1 by drain select devices controlled by control line SGD0 and control line SGD1, respectively. NAND string 140 and NAND string 160 are coupled to source line 0 SL0 by a source select devices controlled by control line SGS0 and control line SGS1, respectively. More NAND strings may have their mid-string devices controlled by control lines MSG2, MSG3, MSG4 or MSG5 and be coupled to bit line 2 BL2, bit line 3 BL3, bit line 4 BL4 or bit line 5 BL5. Various embodiments may have any number of source lines, bit lines, source control lines, drain control lines, word lines, and/or mid-string device control lines. Some embodiments may include control lines for the mid-string devices that may be parallel to the Y axis and at least as wide as two stacks of memory cells, although some may be wide enough in the X direction to control the mid-string devices of multiple pairs of stacks of memory cells.

The third stack of NAND memory cells using body 121 and located adjacent to the second stack of NAND memory cells using body 101 may be separated by a trench 109 in the substrate SUB0 in some embodiments. The trench 109 may be useful in separating the channels of the mid-string devices of adjacent NAND strings, such as NAND string 100 and NAND string 120, which may share control line MSG0. Other embodiments may utilize similar trenches between NAND strings that do not share control lines enabling their mid-string devices, such as NAND string 100 and NAND string 140 in place of or in addition to the trench 109 shown in FIG. 1.

Figure 2:
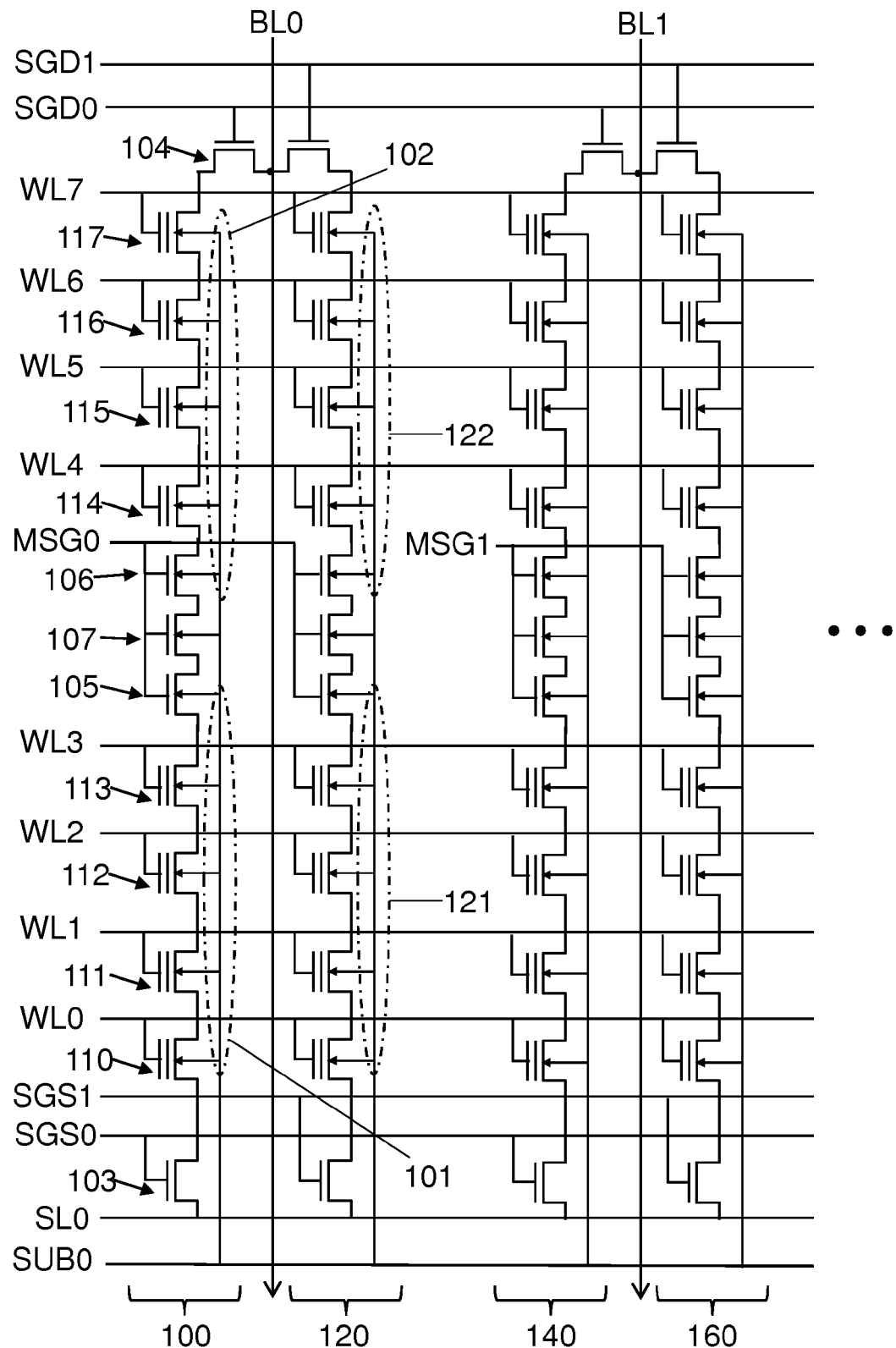
FIG. 2 shows a schematic view of an embodiment of a vertical NAND memory.

FIG. 2 shows a schematic view of an embodiment of a vertical NAND memory 199. The schematic of FIG. 2 includes the front third of the structure shown in FIG. 1 for simplicity, but one of ordinary skill can easily envision the schematic to include the entire structure of FIG. 1 or the schematic of an implementation of millions or billions of memory cells. The vertical NAND memory includes of a 3-dimensional array of non-volatile memory cells organized into NAND strings including a first NAND string 100, a second NAND string 120, a third NAND string 140 and a fourth NAND string 160. The memory cells, such as memory cells 110-117, may include a control gate, a channel between a source and a drain, and an electrically isolated floating gate located between the control gate and the channel. Other embodiments may use charge trap flash technology instead of a floating gate. As shown in FIG. 1, the first stack of memory cells 110-113 using body 101 are coupled to the second stack of memory cells 114-117 using body 102 by the mid-string devices 105-107 to form the first NAND string 100. The third stack of memory cells using body 121 are coupled to the fourth stack of memory cells using body 122 by mid-string devices to form the second NAND string 120. The third NAND string 140 and fourth NAND string 160 are similarly formed using stacks of memory cells located at a different Y dimension than the first and second NAND strings 100, 120.

The memory cells within the NAND strings have their control gates respectively connected to individual word lines WL0-WL7, although the word lines WL0-WL7 may be shared between NAND strings as shown so that a single word line, such as word line 0 WL0, may be connected to many different memory cells. Source select gate 103, controlled by control line SGS0, may couple one end of the first NAND string 100 to source line 0 SL0, and drain select gate 104 controlled by control line SGS0 may couple the other end of the first NAND string 100 to bit line 0 BL0. The other NAND strings may have similar gates to couple them to a respective source line and/or bit line.

The mid-string devices, or FETs, 105-107 may be controlled by control line MSG0 to couple the two stacks of memory cells into the first NAND string 100 if the voltage on control line MSG0 is sufficiently different from the voltage on the substrate SUB0 to turn on the three FETs 105-107. In a different mode of operation, voltage from the substrate SUB0, may be allowed to pass through the first FET 105 to the first body 101 and pass through the second FET 106 to the second body 102. This may be accomplished by floating the control line MSG0 coupled to the gates of the FETs 105-107, so that the substrate SUB0 and the bodies 101, 102, 121, 122, are electrically connected.

Figure 3A:
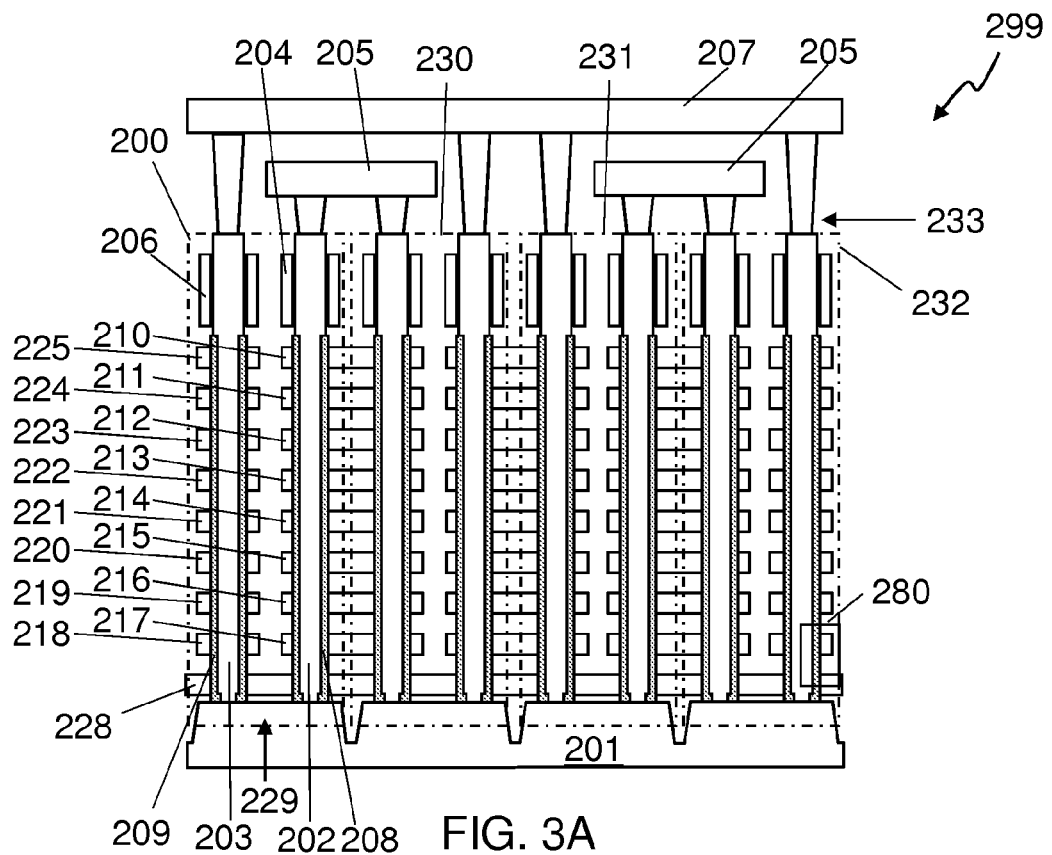
FIG. 3A shows a cross-sectional side view of an alternative embodiment of a vertical NAND memory.

FIG. 3A shows a cross-sectional side view of an alternative embodiment of a vertical NAND memory 299. The cross sectional view is of the X-Z plane with X extending horizontally, Z extending vertically, and Y extending into the page. The alternative embodiment shown in FIG. 3A is similar to the embodiment shown in FIG. 1, except that charge trap flash technology is used in place of floating gate flash technology, gate last fabrication processes are used to provide metal control gates and word line interconnects, and the stacks of memory cells include 8 memory cells instead of 4 memory cells. Other embodiments may use a wide range of other technologies, fabrication processes, and or architecture without departing from the scope of this disclosure.

The section of vertical NAND memory 299 shown in FIG. 3A includes a first NAND string 200, and three other NAND strings 230-232. Additional NAND strings may be located above and/or below the NAND strings 200, 230-232 shown in the Y dimension, and/or left and/or right of the NAND strings 200, 230-232 shown in the X dimension. The NAND strings 200, 230-232 are built on a substrate 201 that may be made of p-doped silicon. The first NAND string 200 is discussed in further detail below, but the description can generally apply to the other NAND strings 230-232.

A first stack of memory cells that share a common body 202 is constructed on the substrate 201. A second stack of memory cells sharing a common body 203 is also constructed on the substrate 201. The first body 202 and the second body 203 may be made of p-doped silicon that is in contact with the substrate at one end and extends away from the substrate 201 in the Z dimension. A first charge trap layer 208 may cover the first body 202 and a second charge trap layer 209 may cover the second body 203. Control gates for the individual memory cells may be made of metal, such as aluminum, nickel, copper, or other metal suitable for deposition in a semiconductor process and may be formed in a gate last process where a sacrificial layer of a material such as a nitride is deposited before the bodies are formed and then replaced by metal in a later part of the fabrication process. The control gates for the individual memory cells of the NAND string 200 are connected to respective word lines 0-15 (WL0-15), which may run in direction parallel to the Y axis. A mid-string gate control line 228 may run in a direction parallel to the X axis and be used as a control gate for one or more mid-string devices 229. The mid-string devices 229 have a first operating mode to couple the substrate 201 to the first body 202 and the second body 203, and a second operating mode that couples the first body 202 to the second body 203 isolated from the substrate 201.

A source select device 204 may be positioned between a source line 205 and the opposite end of the first body 202 than the substrate 201. A drain select device 206 may be positioned between a bit line 207 and the opposite end of the second body 203 from the substrate 201. Vias 233 may be used to connect the bit line 207 to the drain select device 206 and/or source line 205 to the source select device 204. The source select device 204 and/or drain select device 206 may be used to select or isolate a particular NAND string for a read or program operation.

Figure 3B:
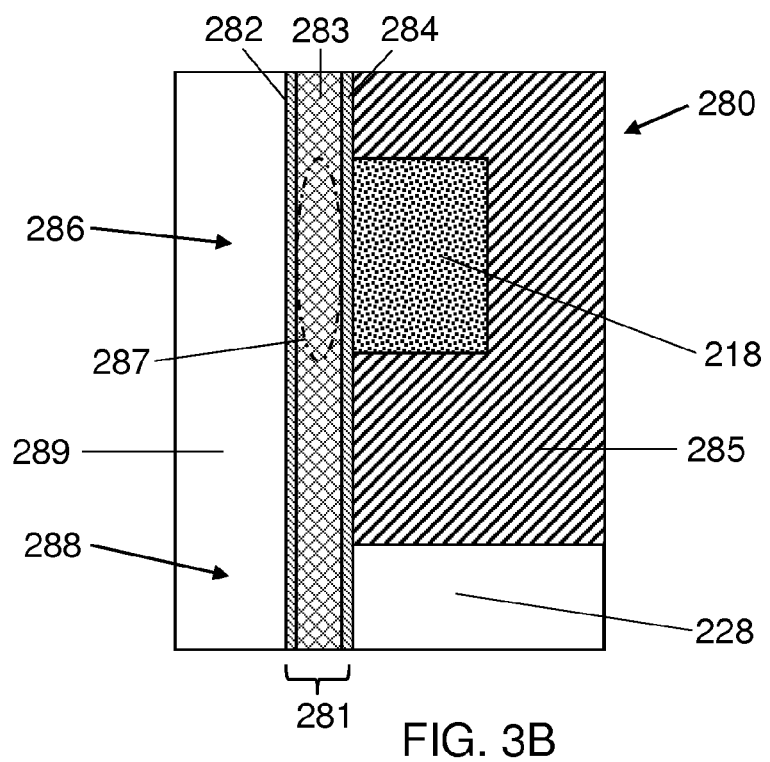
FIG. 3B shows a detailed subsection of the cross-sectional view of FIG. 3A.

FIG. 3B shows a detailed subsection 280 of the cross-sectional view of FIG. 3A. A portion of memory cell 286 is shown in FIG. 3B. The memory cell 286 may utilize charge trap flash (CTF) technology and store charge in a region of generally non-conductive material instead of on a floating gate. A common body 289 of the memory cell 286 may be made of silicon and may be p-doped in some embodiments. The body may have the shape of a pillar, which may be tapered or otherwise non-uniform in shape due to the method of its formation, which in some embodiments, is to fill in a hole formed with a reactive ion etch with silicon. The memory cell 286 may, in some embodiments have a metal/oxide/nitride/oxide/silicon (MONOS) structure as shown. The common body 289 may be surrounded by an oxide/nitride/oxide (ONO) film 281. Surrounded, as used herein and in the claims, means that more than about 50% of the circumference is covered in a cross section of the memory cell 286.

The ONO film 281 may have a structure in which a charge storage layer 283, which may be made of nitride material in some embodiments, is located between an inner tunnel oxide layer 282 and an outer blocking oxide layer 284. The tunnel oxide layer 282 insulates the body 289 from the charge storage layer 283 and may function as a tunnel insulating film during programming as well as blocking leakage of the charge stored in the charge storage layer 283 back into the body 289. The tunnel oxide layer 282 may be thinner than the equivalent layer of the floating gate cell and may be a multi-layer stack itself in some embodiments. The blocking oxide layer 284 insulates the charge storage layer 283 from the control gate 218 to prevent leakage of the stored charge from the charge storage layer 283 into the control gate 218. In some embodiments, the blocking oxide layer 284 may be made of a high-K material such as AlO or HfO to boost the coupling ratio and may be a multi-layer film in some embodiments. Other embodiments may not include a blocking oxide layer 284 giving the memory cell a metal/nitride/oxide/silicon (MNOS) structure. The control gate 218 may be made of metal as described above, although other embodiments may utilize polysilicon. The control gate 218, which is word line 8 in the embodiment shown, may surround the ONO layer, providing a large amount of gate area in a small space for the FET used as the memory cell 286. An insulating material 285, such as an oxide, may be used to fill in the volume between the other elements.

The memory cell 286 operates by storing charge in the charge storage region 287, which may be an annular ring around the body 289 and surrounded by the control gate 218. If a voltage potential is applied between the control gate 218 and the body 289, charge may be moved into or out of the charge storage region 287. If the voltage potential between the control gate 218 and the body 289 is small, the charge stays localized in the charge storage region 287. Because the charge storage material 283 is generally non-conductive, a distinct isolation barrier may not be required in the charge storage material 283 between memory cells.

A portion of one of the mid-string devices 288 is also included in subsection 280. The control gate 228 of the mid-string device 288 may be made of polysilicon or metal or other conductor and may surround the ONO layer 281 surrounding the body 289. In some embodiments, the charge storage layer 283 and/or one of the oxide layers 282, 284 may be omitted for the mid-string device 288, but otherwise, the mid-string device 288 may have a similar structure to the memory cell 286.

Figure 3C:
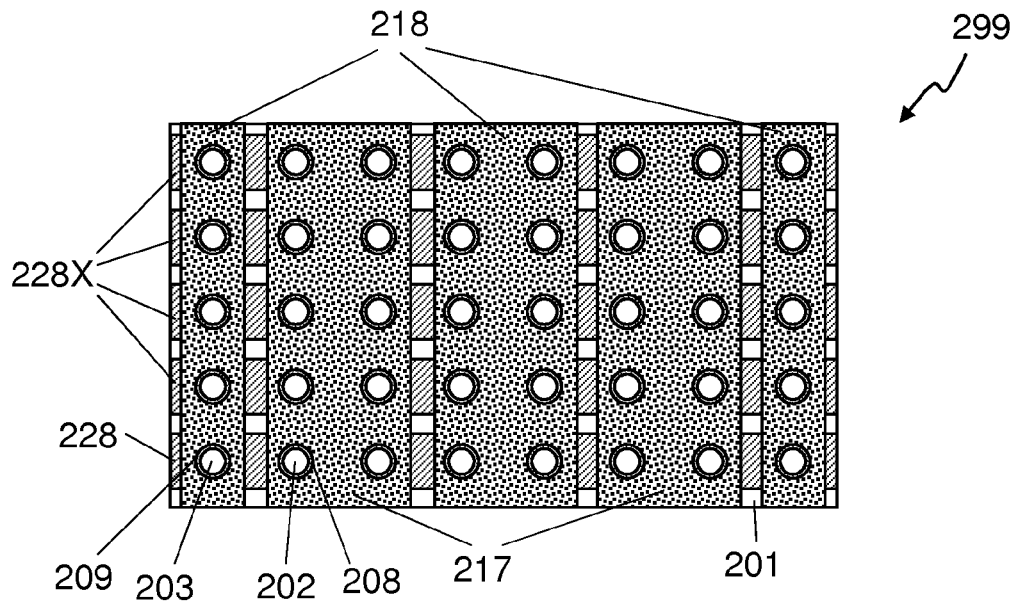
FIG. 3C shows a cross-sectional plan view of the vertical NAND memory of FIG. 3A.

FIG. 3C shows a cross-sectional plan view of the vertical NAND memory 299 of FIG. 3A that is parallel with the substrate. The insulating material 285 that may surround the various structures is transparent to allow the various structures to be seen. The cross-sectional plane of the view shown intersects the word lines 7 217 and word lines 8 218. Due to the fact that a single NAND string is made of two stacks of memory cells, a plane parallel to the substrate may intersect two sets of word lines that may alternate as shown. The pillars of silicon, including the first body 202 and the second body 203, shown as white circles in the cross-sectional view are surrounded by the charge trap layers, including the first charge trap layer 208 and the second charge trap layer 209, shown as grey rings around the pillars of silicon. The various control lines for the mid-string devices, including control line 228 and the other control lines 228X, may also be partially seen and small parts of the substrate 201 may also be visible.

It should be noted that in some embodiments, the pillars of silicon used as bodies for the stacks of memory cells may be tapered. In such embodiments, the size of the cross-section of the pillars may be different at different levels of the stack of memory cells. The thickness of the charge trap layer may also vary depending on the level in the stack of memory cells due to the way that the layers may be deposited during fabrication. Variations in the fabrication process may cause the cross-sectional area of the various pillars and/or thickness of the charge trap layers to vary even at the same level of the stack of memory cells.

Figure 4A:
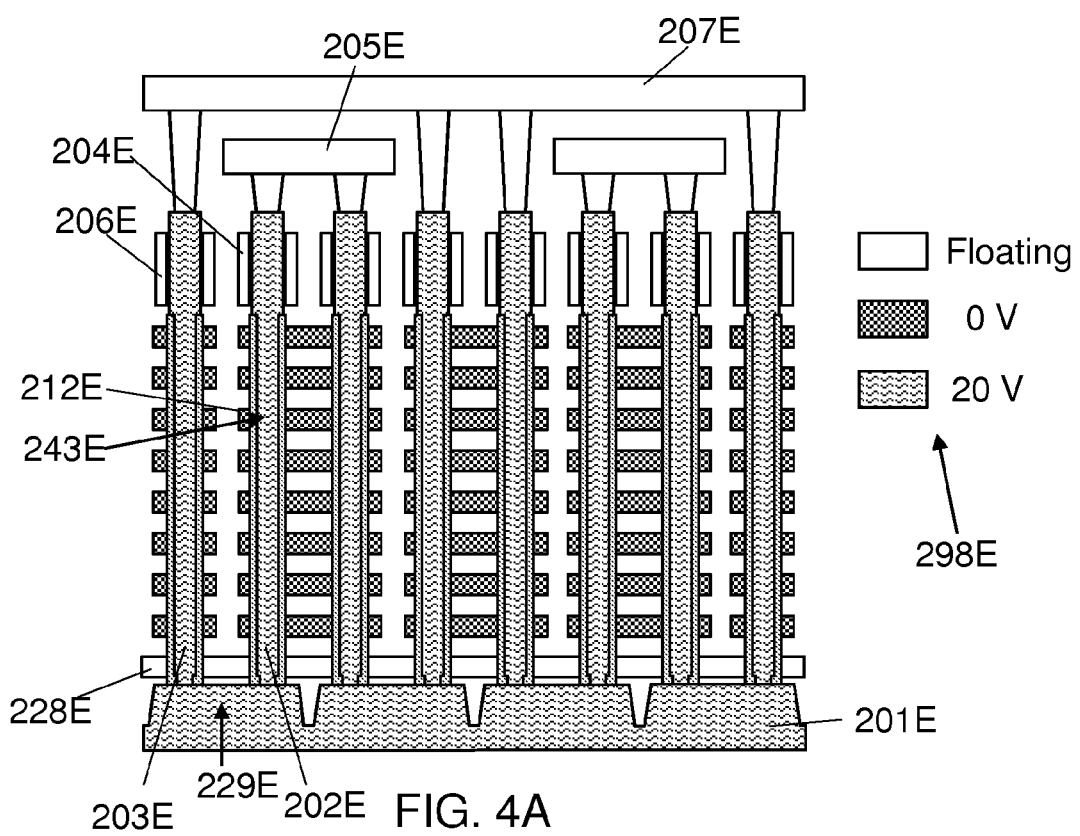
FIGS. 4A, 4B, and 4C show voltages applied to the vertical NAND memory of FIG. 3A during erase, read and program operations, respectively.
Figure 4B:
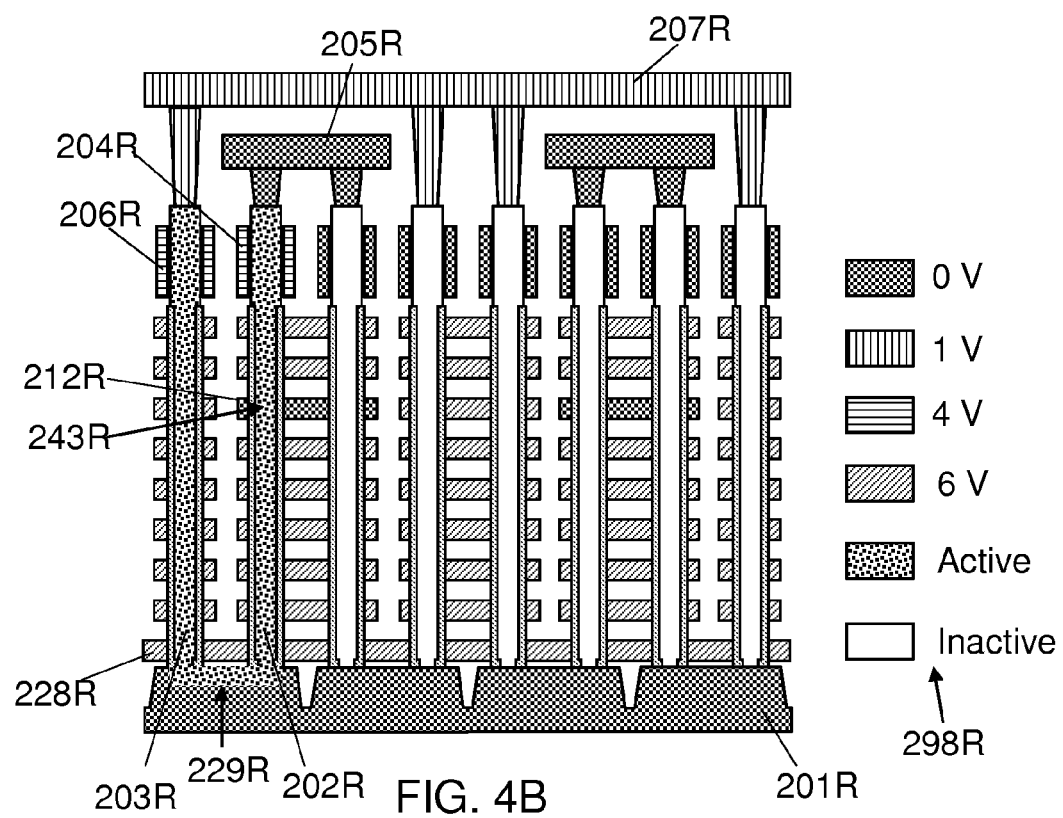
Figure 4C:
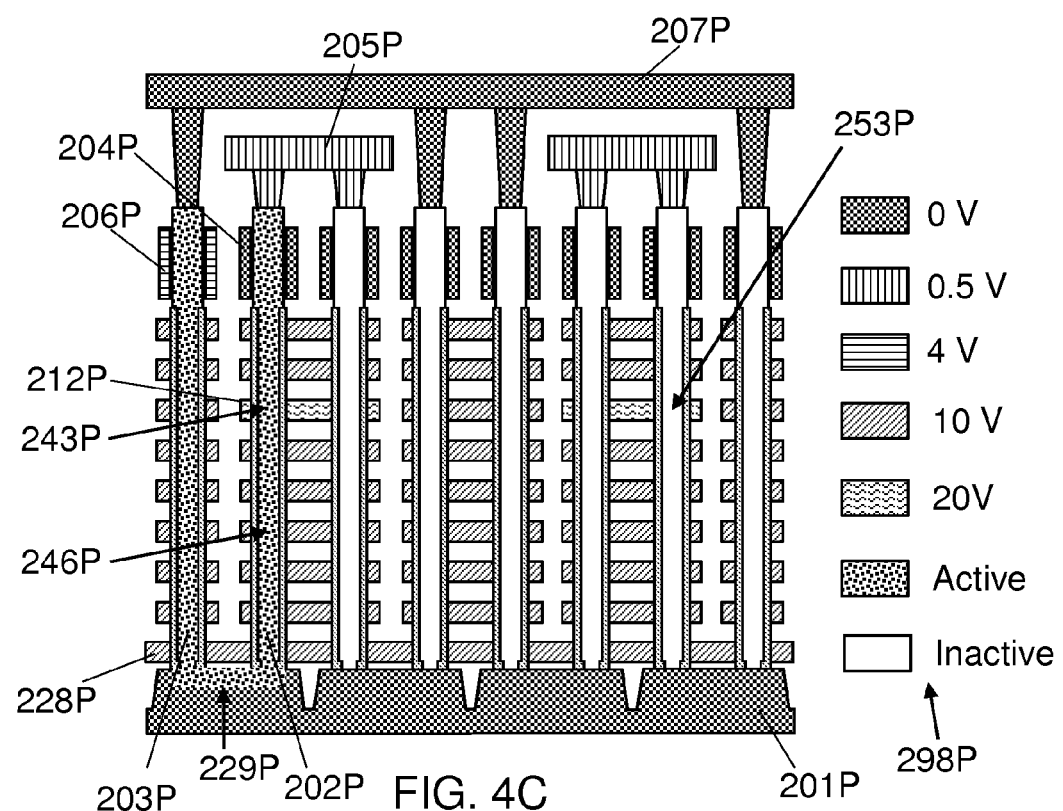

FIGS. 4A, 4B, and 4C show voltages applied to the vertical NAND memory 299 of FIG. 3A during erase, read and program operations, respectively. In this disclosure, erase refers to setting cells to one and programming refers to clearing the cells, or setting cells to zero, but that is merely a convention and could be reversed. The voltages described may be appropriate for one particular embodiment, but may vary dramatically for other embodiments depending on the details of the architecture, the materials, the geometry, and other details of the particular embodiment. In the embodiment shown, the substrate 201 and first and second bodies 202, 203 are p-doped silicon. In other embodiments, various voltages described below may be different, such as in an embodiment where the substrate 201 and the first and second bodies 202, 203 are n-doped silicon and the various voltages may be negative voltages.

An erase operation is shown in FIG. 4A. Legend 298E shows the voltage levels indicated by the various cross-hatching patterns in FIG. 4A. The erase operation erases the eight stacks of eight memory cells shown in the cross-sectional view, including the first stack of memory cells sharing the first body 202E and the second stack of memory cells sharing the second body 203E. In many embodiments, the erase operation may erase a large number of memory cells. The bit line 207E and the source line 205E may be left floating. The control gates of the source select devices and drain select devices, including source select device 204E and drain select device 206E, may be left floating. The control gates of the memory cells, including word line 2 212E, the control gate of memory cell 243E, may be held at an idle voltage of about 0 volts. An erase voltage that may be greater than 10 volts, such as about 20 volts, may be applied to the substrate 201E. The one or more mid-string devices 229E may be controlled by floating the control line 228E. Because the control gate 228E of the mid-string devices 229E is floating, the erase voltage on the substrate 201E propagates to the first body 202E and the second body 203E. With the body of the memory cells, including memory cell 243E, at the erase voltage of about 20 volts, and the control gates of the memory cells, including word line 2 212E, at the idle voltage of about 0 volts, an electric field across the charge storage regions changes the amount of charge stored in the charge storage regions of memory cells, setting the values stored in the cells back to one, which may also be referred to as erasing the cells. The changes to the amount of charge stored in the charge storage region by an erase operation changes the threshold voltage ($V_t$) of the memory cell to a lower value, in some embodiments less than about 0 volts.

FIG. 4B shows a read operation. Legend 298R shows the voltage levels indicated by the various cross-hatching patterns in FIG. 4B. To perform a read operation, the source line 205R may be driven to a read source voltage of about 0 volts and the bit line 207R may be driven to a read sense voltage of about 1 volt. The first NAND string may be selected by driving the control gates of the source select device 204R and drain select device 206R to about 4 volts while driving the control gates of unselected source select devices and drain select devices to about 0 volts. This couples the first body 202R to the select line 205R, applying the read source voltage to the end of the first body 202R opposite of the substrate 201R. It also couples the second body 203R to the bit line 207R, applying the read sense voltage to the end of the second body 203R opposite of the substrate 201R. The control line 228R may be driven to about 6 volts and the substrate 201R driven to about 0 volts to enable the one or more mid-string device to couple the first body 202R to the second body 203R by creating an active channel in the substrate 201R between the two bodies 202R, 203R. A read voltage of about 0 volts may be applied to the control gate 212R of the memory cell 243R to be read. A pass voltage of about 6 volts may be applied to the control gates of the other memory cells that are not being read in the NAND string. By determining the current flow into the second body 203R, the value stored in the memory cell 243R may be determined.

A program operation is shown in FIG. 4C. Legend 298P shows the voltage levels indicated by the various cross-hatching patterns in FIG. 4C. To perform a program operation, the source line 205P may be driven to a program source voltage of about 0.5 volts and the bit line 207P may be driven to a program drain voltage of about 0 volts. The first NAND string may be selected by driving the control gates of the drain select device 206P to about 4 volts while driving the source select device 204P and control gates of unselected source select devices and drain select devices to about 0 volts. This couples the second body 203P to the bit line 207P, applying the program drain voltage, such as about 0 volts, to the end of the second body 203P opposite of the substrate 201P. The control line 228P may be driven to about 10 volts and the substrate 201P driven to about 0 volts to enable the one or more mid-string device 229P to couple the first body 202P to the second body 203P by creating an active channel in the substrate 201P between the two bodies 202P, 203P. This allows that the program drain voltage, such as about 0 volts, to propagate through the mid-string device 229P to the first body 202P. A program voltage of about 20 volts may be applied to the control gate 212P of the memory cell 243P to be programmed. An inhibit voltage of about 10 volts may be applied to the control gates of the other memory cells that are not being programmed in the NAND string. This creates an electric field across the charge storage region of the memory cell 243P, changing the amount of charge stored in the charge storage region to clear the memory cell 243P.

During a programming operation, many memory cells are inhibited from being programmed, and allowed to retain their current state. One group of memory cells that is not programmed includes the other memory cells in a NAND string where at least one memory cell is being programmed, such as memory cell 246P. The memory cell being programmed 243P may have a control gate 212P that is driven to a higher voltage, such as about 20 volts, than the voltage applied to the other control gates of the NAND string, such as about 10 volts. This provides a voltage differential, about 10 volts, across the charge storage regions of the other memory cells, such as memory cell 246P, that is not enough to change their state.

Another group of memory cells that is not programmed includes cells of other NAND strings that have a control gate that is connected to the control gate 212P being driven to the program voltage, such as memory cell 253P. Memory cell 245P may have about 20 volts applied to its control gate, but its body is capacitively coupled to the other control gates, which may be at about 10 volts, as the body is isolated from the source and bit lines. So again, the voltage difference is not enough to change the state of those memory cells, such as memory cell 253P.

Yet another group of memory cells that is not programmed includes cells in other NAND strings that share common drain and source control gates with the NAND string being programmed, but are coupled to different bit lines. This group may include memory cells behind or in front of the cross-sectional view shown. Some of these memory cells may be programmed in conjunction with programming memory cell 243P by applying the program drain voltage of about 0 volts to their respective bit line. For those NAND strings that are not being programmed, their respective bit lines may be driven to about 4 volts, turning off the drain select devices and isolating the bodies of the NAND strings from the bit lines and allowing the bodies to capacitively couple to their control gates which may be at about 10 volts, resulting in an insufficient voltage differential across those charge storage regions to change the memory state. The changes to the amount of charge stored in the charge storage region by a programming operation changes the threshold voltage ($V_t$) of the memory cell to a higher value, in some embodiments more than about 0 volts.

Figure 5:
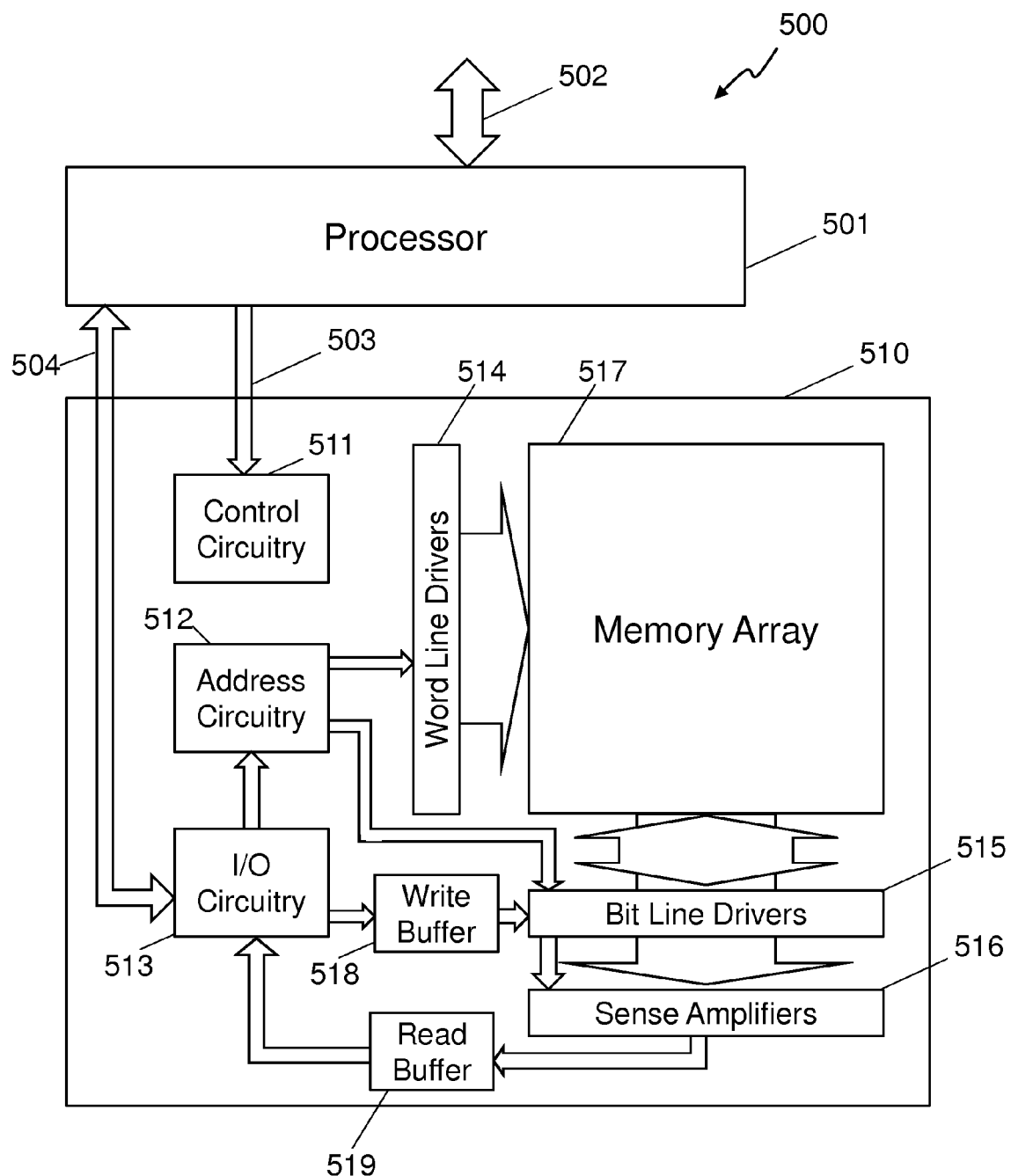
FIG. 5 is a block diagram of an embodiment of an electronic system.

FIG. 5 is a block diagram of an embodiment of an electronic system 500. Many different embodiments of the electronic system 500 are possible other than the embodiment shown, including using a single processor 501 to control multiple memory devices 510 to provide for more storage space, multiple processors 501 connected to memory devices 510, and systems including a variety of other functionality.

The processor 501 may be coupled to the memory device 510 with control lines 503 and data lines 504. In some embodiments data and control may utilize the same lines. The processor 501 may be an external microprocessor, microcontroller, or some other type of external controlling circuitry. In some embodiments, the processor 501 may be integrated in the same package or even on the same die as the memory device 510. In some embodiments, the processor 501 may be integrated with the control circuitry 511, allowing some of the same circuitry to be used for both functions. The processor 501 may have external memory, such as RAM and ROM, used for program storage and intermediate data or it may have internal RAM or ROM. In some embodiments, the processor may use the memory device 510 for program or data storage. A program running on the processor 501 may implement many different functions including, but not limited to, a standard file system, a flash file system, write leveling, bad cell or block mapping, and error management. The storage system 500 has been simplified to focus on features of the memory that are helpful in understanding this disclosure.

In some embodiments an external connection 502 is provided. The external connection 502 is coupled to the processor 501 and allows the processor 501 to communicate to devices external to electronic system 500, which may provide the external device with non-volatile storage. The processor 501 may receive write commands and write data through the external connection and store the write data in the memory device. The processor 501 may also receive read commands from the external connection, retrieve read data through the at least one non-volatile memory device, and send the read data through the external connections.

The external connection may be used to connect to a computer or other intelligent device such as a cell phone or digital camera using a standard or proprietary communication protocol. Examples of computer communication protocols that the external connection may be compatible with include, but are not limited to, any version of the following protocols: Universal Serial Bus (USB), Serial Advanced Technology Attachment (SATA), Small Computer System Interconnect (SCSI), Fibre Channel, Parallel Advanced Technology Attachment (PATA), Integrated Drive Electronics (IDE), Ethernet, IEEE-1394, Secure Digital Card interface (SD Card), Compact Flash interface, Memory Stick interface, Peripheral Component Interconnect (PCI) or PCI Express (PCIe).

A host device such as a computer, set-top box (STB), server, or mobile device, including, but not limited to, a smartphone, handset, tablet, notebook computer, personal digital assistant (PDA) or the like, may connect to the external connection 502 of the electronic system 500. In some embodiments, the electronic system 500 may be incorporated into the host device or the electronic system 500 may be plugged into a socket in the host device. Other embodiments may use a cable to connect between the host device and the external connection 502 of the electronic system 500. The host device may be capable of sending read and/or write commands to the electronic system 500 over the external connection 502 and may use the electronic system 500 for storage of digital data such as digital music, digital photos, digital video, documents, programs, or other digital data.

The memory device 510 includes an array 517 of stacks of NAND memory cells, such as the ones illustrated previously in FIG. 1-3. The memory array 517 may be arranged in banks with word line rows and bit line columns. In one embodiment, the bit lines of the memory array 517 are coupled to multiple NAND strings of vertical NAND memory cells.

Address buffer circuitry 512 may be provided to latch address signals provided through the I/O circuitry 513. Address signals are received and decoded by word line drivers 514 and bit line drivers 515 to access the memory array 517. It may be appreciated by those skilled in the art, with the benefit of the present description that the number of address input connections depends on the density and architecture of the memory array 517. That is, the number of addresses increases with both increased memory cell counts and increased bank and block counts.

The memory device 510 may read data in the memory array 517 by sensing voltage or current changes in the memory array columns using sense amplifier circuitry 516. The sense amplifier circuitry 516, in one embodiment, is coupled to read and latch a row of data from the memory array 517. Write buffers 518 may be used in some embodiments to accumulate data until a write can be performed and read buffers 519 may hold data read from the memory array 517 until it can be sent out through the data lines 504. The I/O circuitry 513 routes the data through the I/O pins of the memory device 510.

Memory control circuitry 511 may decode commands provided on control lines 503 from the processor 501. These commands are used to control the operations on the memory array 517, including data read, data write (program), and erase operations. The memory controller circuitry 511 may be a state machine, a sequencer, a processor, or some other type of controller to generate the voltage waveforms necessary to control the memory array 517. The control circuitry 511 communicates with the other blocks in the memory device but those connections are not shown as they would overly complicate the block diagram 500 and one skilled in the art can understand that the control circuitry 511 has numerous interconnections with the other blocks in order to control their functions. In one embodiment, the memory control circuitry 511 may be configured to execute the erasing method, and/or other methods of the present disclosure.

Figures 6, 7:
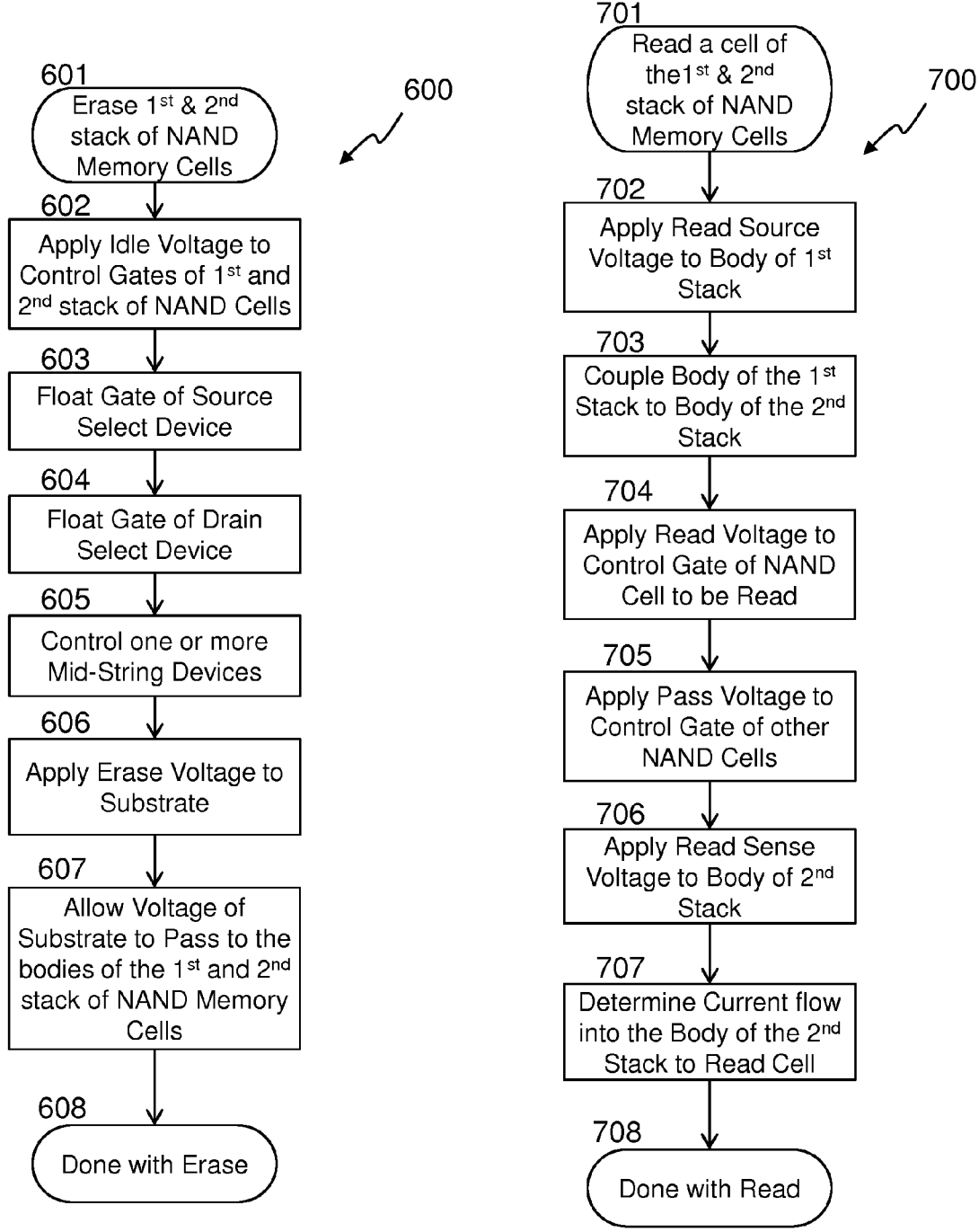
FIG. 6 is a flowchart describing an embodiment of a method of erasing a vertical NAND memory.
FIG. 7 is a flowchart describing an embodiment of a method for reading a vertical NAND memory.

FIG. 6 is a flowchart 600 describing an embodiment of a method of erasing a vertical NAND memory. Flowchart 600 starts at block 601 to erase a group of memory cells including a first and a second stack of NAND memory cells. In many embodiments a larger group of memory cells may be erased that may include many stacks of NAND memory. The first stack of NAND memory cells share a first body constructed on a substrate and the second stack of NAND memory cells share a second body constructed on a substrate. An idle voltage is applied to one or more control gates of the first and second stack of NAND memory cells in block 602. In some embodiments, the control gates of the memory cells of the first and second stack of NAND memory cells may be set to the idle voltage. The value of the idle voltage may vary between embodiments.

In some embodiments, the first body may be coupled to a source line through a source select device and the second body may be coupled to a bit line through a drain select device. The source select device may be controlled by floating, or disconnected from a voltage or current source, the control gate of the source select device at block 603, and at block 604, drain select device may be controlled by floating the control gate of the drain select device. This may allow the source and bit lines to couple with the first and second body respectively. At block 605, one or more mid-string devices positioned between the substrate and the control gates of the first and second stacks of NAND memory cells are controlled to allow the substrate to couple to the first and second bodies of the NAND memory cells. In one embodiment, control the mid-string devices may entail allowing the control gates of the one or more mid-string devices to float. The configuration of the mid-string devices may vary between embodiments, but in one embodiment, may include three FETs with a common control gate. An erase voltage is applied to the substrate at block 606. The erase voltage may be different enough from the idle voltage to change the amount of charge stored in the charge storage regions of the memory cells. The erase voltage may then propagate through the one or more mid-string devices to the first and second bodies of the first and second stack of NAND memory cells at block 607. The erase voltage may also propagate to the source and/or bit lines. After enough time has passed to change the amount of charge stored in the charge storage regions, the erase is complete at block 608. The amount of time may vary between embodiments, depending on the technologies employed.

FIG. 7 is a flowchart 700 describing an embodiment of a method for reading a cell out of a group of memory cells in a vertical NAND memory starting at block 701. The group of memory cells includes a first and a second stack of NAND memory cells. A read source voltage is applied to the body of the first stack of memory cells, or first body, at block 702. The read source voltage may be applied to the first body at the opposite end of the first body from the substrate. The read source voltage may be applied through a source select device that is positioned between a source line and the first body by enabling the source select device. The source line may be driven to the read source voltage so that by enabling the source select device, the read source voltage may propagate from the source line to the first body.

The first body may be coupled to the body of the second stack of memory cells, or second body, at block 703. The coupling may be accomplished by controlling the substrate and the one or more mid-string devices. In one embodiment, the mid-string devices are turned on to couple the first body to the second body while isolating the bodies from the substrate by driving a control gate of the mid-string devices to a different voltage than the substrate. The voltage differential may vary depending on the embodiment. At block 704 a read voltage may be applied to a control gate of the memory cell to be read and a pass voltage applied to control gates of memory cells of the group of memory cells that are not being read at block 705.

A read sense voltage is applied to the body of the second stack of memory cells at block 706. The read sense voltage may be applied to the second body at the opposite end of the second body from the substrate. The read sense voltage may be applied through a drain select device that is positioned between a bit line and the second body by enabling the drain select device. The enabling of the drain select device, along with the source select device, may be considered selecting the group of memory cells. The bit line may be driven to the read sense voltage so that by enabling the drain select device, current is able to flow into the second body. If the charge stored in the memory cell to be read is enough that the cell is in a conductive state with its control gate at the read voltage, current may flow into the second body. If the charge stored in the memory cell to be read is not enough for the cell is not in a conductive state with its control gate at the read voltage, current may not flow into the second body. The amount of current flowing into the second body may be determined at block 707 to allow the state of the memory cell to be read to be ascertained. The read operation ends at bock 708

Figure 8:
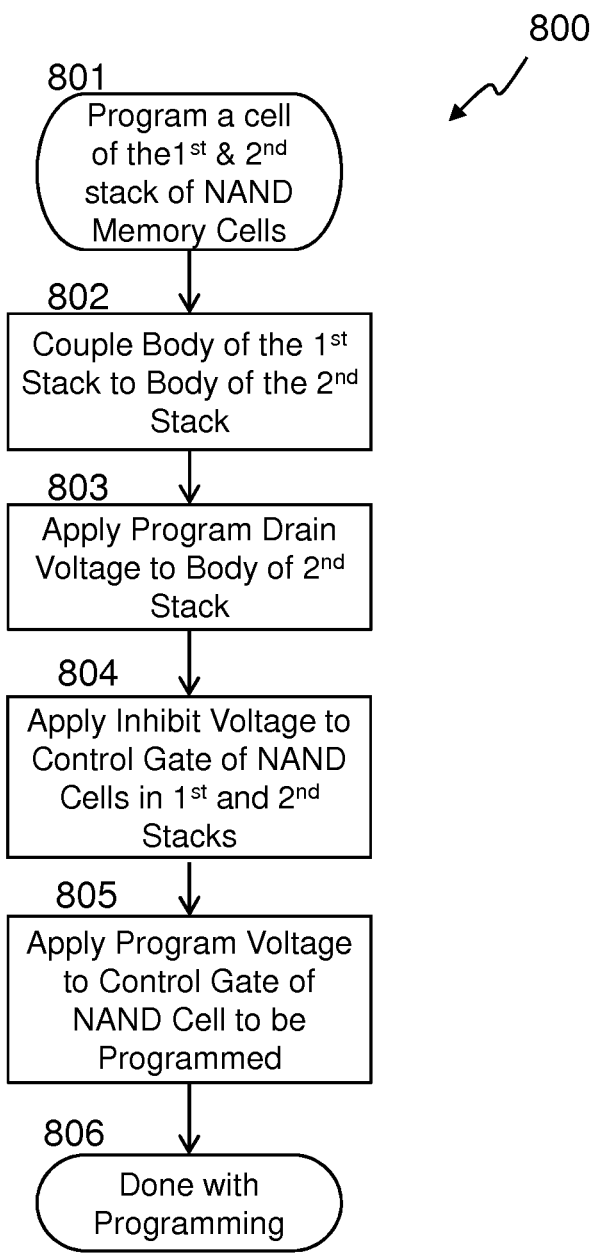
FIG. 8 is a flowchart describing an embodiment of a method for programming a vertical NAND memory.

FIG. 8 is a flowchart 800 describing an embodiment of a method for programming a cell out of a group of memory cells in a vertical NAND memory starting at block 801. The group of memory cells includes a first and a second stack of NAND memory cells. The first body may be coupled to the body of the second stack of memory cells, or second body, at block 802. The coupling may be accomplished by controlling the substrate and the one or more mid-string devices. In one embodiment, the mid-string devices are turned on to couple the first body to the second body while isolating the bodies from the substrate by driving a control gate of the mid-string devices to a different voltage than the substrate. The voltage differential may vary depending on the embodiment.

A program drain voltage is applied to the body of the second stack of memory cells at block 803. The program drain voltage may be applied to the second body at the opposite end of the second body from the substrate. The program drain voltage may be applied through a drain select device that may be positioned between a bit line and the second body by enabling the drain select device. A source select device that may be positioned between a source line and the first body may be turned off so that the first body is isolated from the source line. The source select device may be turned off by applying a program source voltage to the source line and applying about 0 volts to the control gate of the source select device. The enabling of the drain select device, along with turning off the source select device, may be considered selecting the group of memory cells for programming. The program drain voltage may propagate through both the first body and the second body through the mid-string devices.

At block 804, an inhibit voltage may be applied to the control gates of the group of memory cells, including the first and second stack of NAND memory cells. Then at block 805, a program voltage may be applied to a control gate of the memory cell of the group of memory cells to be programmed. After enough time has passed to change the amount of charge stored in the charge storage regions, the programming operation is complete at block 806. The amount of time may vary between embodiments, depending on the technologies employed.

The flowcharts and/or block diagrams in the figures help to illustrate the architecture, functionality, and operation of possible implementations of devices, systems, and methods of various embodiments. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that the blocks of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is appreciated that the claimed subject matter has been explained with reference to exemplary embodiments, and that the claimed subject matter is not limited to the specific details given above. References in the specification made to other embodiments fall into the scope of the present claimed subject matter.

Any reference to device may include a component, circuit, module, or any such mechanism in which the device can achieve the purpose or description as indicated by the modifier preceding the device. However, the component, circuit, module, or any such mechanism is not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element. As used herein, the term "coupled" includes direct and indirect connections. Moreover, where first and second devices are coupled, intervening devices including active devices may be located there between.

Those skilled in the art having the benefit of this disclosure will appreciate that many other variations from the foregoing description and drawings may be made within the scope of the present claimed subject matter. Indeed, the claimed subject matter is not limited to the details described above, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method to control a group of memory cells, the method comprising:
    erasing the group of memory cells, the group of memory cells including a first stack of NAND memory cells sharing a first body constructed on a substrate, and a second stack of NAND memory cells sharing a second body constructed on the substrate, by:
        applying an idle voltage to first control gates of the first stack of NAND memory cells and second control gates of the second stack of NAND memory cells;
        applying an erase voltage to the substrate; and
        controlling one or more mid-string devices positioned between the substrate and the first and second stacks of NAND memory cells to allow the erase voltage to propagate to the first body and the second body.
2. The method of claim 1, wherein the first body and the second body comprise p-doped silicon, the substrate comprises p-doped silicon, or the erase voltage is greater than the idle voltage, or combinations thereof.

3. The method of claim 2, wherein the idle voltage is about 0 volts and the erase voltage is greater than about 10 volts, and the control of the one or more mid-string devices comprises allowing a gate of the one or more mid-string devices to float.

4. The method of claim 1, further comprising:
controlling a source select device positioned between a source line and an end of the first body opposite of the substrate by floating the gate of the source select device and the source line; and
controlling a drain select device positioned between a bit line and an end of the second body opposite of the substrate by floating the gate of the drain select device and the bit line.

5. The method of claim 1, further comprising:
reading a memory cell of the group of memory cells by:
applying a read source voltage to an end of the first body opposite of the substrate;
coupling the first body to the second body by controlling the substrate and the one or more mid-string devices;
applying a read voltage to a control gate of the memory cell to be read;
applying a pass voltage to control gates of memory cells of the group of memory cells that are not being read;
applying a read sense voltage to an end of the second body opposite of the substrate; and
determining a current flow into the second body.

6. The method of claim 5, wherein the group of memory cells is included in an array of memory cells, and the method further comprises:
selecting the group of memory cells by:
enabling a source select device positioned between a source line and an end of the first body opposite of the substrate; and
enabling a drain select device positioned between a bit line and an end of the second body opposite of the substrate;
wherein the source line is driven to the read source voltage and the bit line is driven to the read sense voltage.

7. The method of claim 6, wherein the first body and the second body comprise p-doped silicon, the substrate comprises p-doped silicon, the read source voltage is about 0 volts, the read voltage is about 0 volts, the pass voltage is about 6 volts, or the read sense voltage is about 1 volt, or combinations thereof;
the source select device is enabled by applying about 4 volts to a gate of the source select device;
the drain select device is enabled by applying about 4 volts to a gate of the drain select device; and
the first body is coupled to the second body by applying a voltage of about 0 volts to the substrate and applying a voltage of about 6 volts to the gate of the one or more mid-string devices.

8. The method of claim 1, further comprising:
programming a memory cell of the group of memory cells by:
coupling the first body to the second body by controlling the substrate and the one or more mid-string devices;
applying a program drain voltage to an end of the second body opposite of the substrate;
applying an inhibit voltage to control gates of memory cells that are not being programmed in the group of memory cells; and
applying a program voltage to a control gate of the memory cell to be programmed.

9. The method of claim 8, wherein the group of memory cells is included in an array of memory cells, and the method further comprises:
selecting the group of memory cells by:
turning off a source select device positioned between a source line and an end of the first body opposite of the substrate; and
enabling a drain select device positioned between a bit line and an end of the second body opposite of the substrate; and
wherein the bit line is driven to the program drain voltage.

10. The method of claim 9, wherein the first body and the second body comprise p-doped silicon, the substrate comprises p-doped silicon, the program voltage is about 20 volts, the inhibit voltage is about 10 volts, or the program drain voltage is about 0 volts, or combinations thereof;
the source select device is turned off by applying about 0 volts to a gate of the source select device and applying a voltage to the source line of greater than the voltage applied to the gate of the source select device;
the drain select device is enabled by applying about 4 volts to a gate of the drain select device; and
the first body is coupled to the second body by applying a voltage of about 0 volts to the substrate and applying a voltage of about 10 volts to the gate of the one or more mid-string devices.

11. The method of claim 1, further comprising:
not erasing the group of memory cells by:
floating the first control gates of the first stack of NAND memory cells and the second control gates of the second stack of NAND memory cells;
disabling a source select device positioned between a source line and an end of the first body opposite of the substrate by driving the gate of the source select device to about 0 volts; and
disabling a drain select device positioned between a bit line and an end of the second body opposite of the substrate by driving the gate of the drain select device to about 0 volts.

12. A memory device comprising:
a first stack of NAND memory cells sharing a first body, the NAND memory cells of the first stack including a first set of control gates, and a first set of charge storage regions located between the first set of control gates and the first body;
a second stack of NAND memory cells sharing a second body, the NAND memory cells of the second stack including a second set of control gates, and a second set of charge storage regions located between the second set of control gates and the second body; and
one or more mid-string devices positioned between a substrate and the first and second stacks of NAND memory cells, the one or more mid-string devices capable of coupling the substrate to the first and second bodies in a first mode of operation, and capable of coupling the first body to the second body, isolated from the substrate, in a second mode of operation.

13. The memory device of claim 12, wherein the first stack of NAND memory cells and the second stack of NAND memory cells are capable of being erased by:
an idle voltage applied to the first set of control gates and the second set of control gates;
an erase voltage applied to the substrate; and
control of the one or more mid-string devices to function in the first mode of operation to allow the erase voltage to propagate to the first body and the second body.

14. The memory device of claim 12, wherein the respective charge storage regions of the first and second stack of NAND memory cells comprise a floating gate.

15. The memory device of claim 12, wherein more than a single binary bit of information can be stored in a respective charge storage region of the first and second stack of NAND memory cells by controlling the amount of charge stored in the respective charge storage region.

16. The memory device of claim 12, further comprising:
a source select device positioned between a source line and an end of the first body opposite of the substrate; and
a drain select device positioned between a bit line and an end of the second body opposite of the substrate.

17. The memory device of claim 12, wherein the one or more mid-string devices comprise:
a first field effect transistor (FET) positioned between the substrate and the first stack of NAND memory cells, the first FET using a portion of the first body as a channel;
a second FET positioned between the substrate and the second stack of NAND memory cells, the second FET using a portion of the second body as a channel; and
a third FET positioned between the first and second FET and using a portion of the substrate as a channel;
wherein control gates of the first, second and third FET are coupled together.

18. The memory device of claim 12, wherein the substrate comprises p-doped silicon, the first and second bodies comprise p-doped silicon, the first set of control gates and the second set of control gates comprise polysilicon, the first stack of NAND memory cells comprise at least eight memory cells, and the second stack of NAND memory cells comprise an equal number of memory cells as the first stack of NAND memory cells.

19. The memory device of claim 12, further comprising:
a third stack of NAND memory cells adjacent to the second stack of NAND memory cells; and
a trench in the substrate separating the second stack of NAND memory cells from the third stack of NAND memory cells.

20. The memory device of claim 12, further comprising:
a pillar of silicon extending out from the substrate in a substantially perpendicular direction with one end in contact with the substrate, the pillar of silicon having a substantially circular cross-section and suitable for use as the first body;
a layer of charge trapping material surrounding the pillar of silicon suitable for the first set of charge storage regions; and
two or more control gates surrounding the pillar of silicon suitable for the first set of control gates, the two or more control gates comprised of metal and isolated by non-conductive layers.

21. An electronic system comprising:
a processor capable of generating memory control commands; and
at least one memory device coupled to the processor and operating in response to the memory control commands, the at least one memory device comprising:
a first stack of NAND memory cells sharing a first body, the NAND memory cells of the first stack including a first set of control gates, and a first set of charge storage regions located between the first set of control gates and the first body;
a second stack of NAND memory cells sharing a second body, the NAND memory cells of the second stack including a second set of control gates, and a second set of charge storage regions located between the second set of control and the second body; and
one or more mid-string devices positioned between a substrate and the first and second stacks of NAND memory cells, the one or more mid-string devices capable of coupling the substrate to the first and second bodies in a first mode of operation, and capable of coupling the first body to the second body, isolated from the substrate, in a second mode of operation.

22. The electronic system of claim 21, further comprising an external connection, the external connection coupled to the processor; wherein
the processor is capable of receiving write commands and write data through the external connection and storing the write data in the at least one memory device; and
the processor is capable of receiving read commands from the external connection, retrieving read data through the at least one memory device, and sending the read data through the external connection.

23. The electronic system of claim 22, wherein the external connection provides for a computer communication protocol.

24. The electronic system of claim 22, further comprising:
a host device coupled to the external connection;
wherein the host device is capable of sending at least the read commands to the processor.

25. The electronic system of claim 22, wherein the host device is a mobile device.

26. The electronic system of claim 21, wherein more than a single binary bit of information can be stored in a respective charge storage region of the first and second stack of NAND memory cells by controlling the amount of charge stored in the respective charge storage region.

27. The electronic system of claim 21, wherein the first stack of NAND memory cells and the second stack of NAND memory cells are capable of being erased by:
an idle voltage applied to the first set of control gates and the second set of control gates;
an erase voltage applied to the substrate; and
control of the one or more mid-string devices to function in the first mode of operation to allow the erase voltage to propagate to the first body and the second body.

28. The electronic system of claim 21, the at least one memory device further comprising:
a source select device positioned between a source line and an end of the first body opposite of the substrate; and
a drain select device positioned between a bit line and an end of the second body opposite of the substrate.

29. The electronic system of claim 21, wherein the one or more mid-string devices comprise:
a first field effect transistor (FET) positioned between the substrate and the first stack of NAND memory cells, the first FET using a portion of the first body as a channel;
a second FET positioned between the substrate and the second stack of NAND memory cells, the second FET using a portion of the second body as a channel; and
a third FET positioned between the first and second FET and using a portion of the substrate as a channel;
wherein control gates of the first, second and third FET are coupled together.

30. The electronic system of claim 21, wherein the substrate comprises p-doped silicon, the first and second bodies comprise p-doped silicon, the first set of control gates and the second set of control gates comprise polysilicon, the first stack of NAND memory cells comprise at least eight memory cells, and the second stack of NAND memory cells comprise an equal number of memory cells as the first stack of NAND memory cells.

* * * * *